United States Patent [19]
Diaz et al.

[11] Patent Number: 5,688,348
[45] Date of Patent: Nov. 18, 1997

[54] ANECHOIC CHAMBER ABSORBER AND METHOD

[75] Inventors: Rodolfo E. Diaz; Mark C. Squires, both of Phoenix; Michael C. Miller, Chandler, all of Ariz.

[73] Assignee: Northrop Grumman Corporation, Los Angeles, Calif.

[21] Appl. No.: 779,542

[22] Filed: Jan. 8, 1997

Related U.S. Application Data

[62] Division of Ser. No. 368,785, Jan. 4, 1995, Pat. No. 5,594, 218.

[51] Int. Cl.$^6$ .................... B29C 73/10; H01Q 17/00
[52] U.S. Cl. .................... 156/197; 342/4
[58] Field of Search ............... 181/292, 295, 181/294; 156/197, 277, 278; 342/1-4; 428/116, 118

[56] References Cited

U.S. PATENT DOCUMENTS

| | | | |
|---|---|---|---|
| 2,985,880 | 5/1961 | McMillan | 342/4 |
| 3,234,549 | 2/1966 | McMillan | 342/4 |
| 3,631,492 | 12/1971 | Suetake | 342/4 |
| 3,836,967 | 9/1974 | Wright | 342/4 |
| 3,890,060 | 6/1975 | Lipstein . | |
| 4,477,505 | 10/1984 | Warnaka | 181/294 X |
| 4,496,950 | 1/1985 | Hemming et al. . | |
| 4,889,750 | 12/1989 | Wiley . | |
| 5,039,949 | 8/1991 | Hemming et al. . | |
| 5,229,773 | 7/1993 | Dauwen et al. . | |
| 5,260,513 | 11/1993 | Giles et al. . | |
| 5,278,562 | 1/1994 | Martin et al. . | |
| 5,312,511 | 5/1994 | Fell . | |
| 5,331,567 | 7/1994 | Gibbons et al. . | |
| 5,385,623 | 1/1995 | Diaz | 156/197 |

FOREIGN PATENT DOCUMENTS 3631492 12/1972 Japan .

*Primary Examiner*—Khanh Dang
*Attorney, Agent, or Firm*—Terry J. Anderson; Karl J. Hoch, Jr.

[57] ABSTRACT

An EMR-absorbing anechoic chamber absorber (22, 42) uses a block of honeycomb material with a lossy material, such as carbon, applied to the sheets (4) of material from which the honeycomb is made to create wedges (36) or pyramids (44) of lossy material. Preferably, the lossy material is applied to the sheets of material in a repeating wedge-shaped pattern (16) to create the wedges of lossy material within the solid rectangular block of honeycomb material. Parallel, wedge-shaped grooves (43) are formed in the block of honeycomb material to create the pyramids of lossy material. If the lossy material is applied to the entire sheet, a set of parallel, wedge-shaped grooves are formed in the block of honeycomb material to create wedges of lossy material; two sets of parallel, wedge-shaped grooves are formed at 90° angles to one another to create pyramids of lossy material.

12 Claims, 4 Drawing Sheets

ANECHOIC CHAMBER ABSORBER AND METHOD

This application is a division of application Ser. No. 08/368,785, filed Jan. 4, 1995, now U.S. Pat. No. 5,594,218.

BACKGROUND OF THE INVENTION

Anechoic chambers typically have their interior surfaces covered with wedge-shaped and pyramid-shaped blocks of polyurethane foam injected with carbon. Carbon acts as a lossy material absorbing electromagnetic radiation (EMR). These foam blocks are typically 6 feet (1.8 m) tall when testing in certain frequency ranges, such as 200 MHz to 500 MHz and up. The wedge-shaped blocks are used along the side walls, ceiling and floor while pyramid-shaped blocks are used at either end of the room, that is, behind the radiation source and behind the target. Pyramid-shaped blocks are used whenever radiation is expected to strike the surface generally straight on. Therefore the pyramid-shaped blocks are also used along the side walls near each end of the chamber.

Conventional foam absorbers, in particular the pyramid-shaped absorbers, are quite heavy, can sag (reducing their effectiveness and requiring replacement) and take up a substantial amount of space. The large size of the foam wedges and pyramids forces the use of a great deal of absorber material and a large room to create only a modest size chamber. The weight of the foam absorbers mandates that the walls and ceiling be made quite strong, thus increasing the cost of construction.

SUMMARY OF THE INVENTION

The present invention is directed to an anechoic chamber absorber, and method for making the anechoic chamber absorber from honeycomb, which is relatively lightweight, stiff, has low toxicity in the event of fire and can be made to be about one-half the height of conventional foam block absorbers. Reducing the size of the absorber can drastically reduce the dimension requirements for the basic anechoic chamber room structure and reduces the amount of absorber material which must be used by about 50%.

The anechoic chamber absorber suitable for absorbing electromagnetic radiation is made using a block of honeycomb material. The honeycomb material includes wedges or pyramids of a lossy material, such as carbon. The wedges and pyramids can be formed within a rectangular block of honeycomb without the need for machining.

The lossy material is preferably applied to sheets of material from which the honeycomb is made. If the lossy material is applied to the entire sheet, the wedges or pyramids of lossy material are created by forming a set of parallel, wedge-shaped grooves in the block of honeycomb material to create wedges of lossy material. Two sets of parallel, wedge-shaped grooves formed at 90° angles to one another are used to create pyramids of lossy material.

The lossy material is preferably applied to the sheets of material in a repeating wedge-shaped pattern. On forming the block of honeycomb material, wedges of lossy material are formed within the solid rectangular block of honeycomb material without the need for cutting wedge-shaped grooves into the block. To create pyramids of lossy material, wedge-shaped grooves of the honeycomb material are removed from the block of honeycomb material. The grooves are cut at 90° angles to the wedges of lossy material so that truncated wedge-shaped sections of lossy material are removed to create a grooved block of honeycomb material having pyramids of lossy material within the grooved block.

A primary advantage of the invention is the ability to reduce the size of anechoic chamber absorbers from, for example, 6 feet (1.8 m) to 3 feet (0.9 m) tall when dealing with EMR in the range of 300 MHz to above 1 GHz. This provides a substantial cost saving both as to the size and construction of the room and the amount of material needed. Reducing the weight of the absorber material reduces construction costs since the walls of the room need not be made extra strong to support the weight of conventional foam absorbers. Using honeycomb absorber materials also allows one to customize the absorber properties when desired.

Other features and advantages of the invention will appear from the following description in which the preferred embodiments have been set forth in detail in conjunction with the accompanying drawings.

DESCRIPTION OF THE PREFERRED EMBODIMENT

Figure 1:
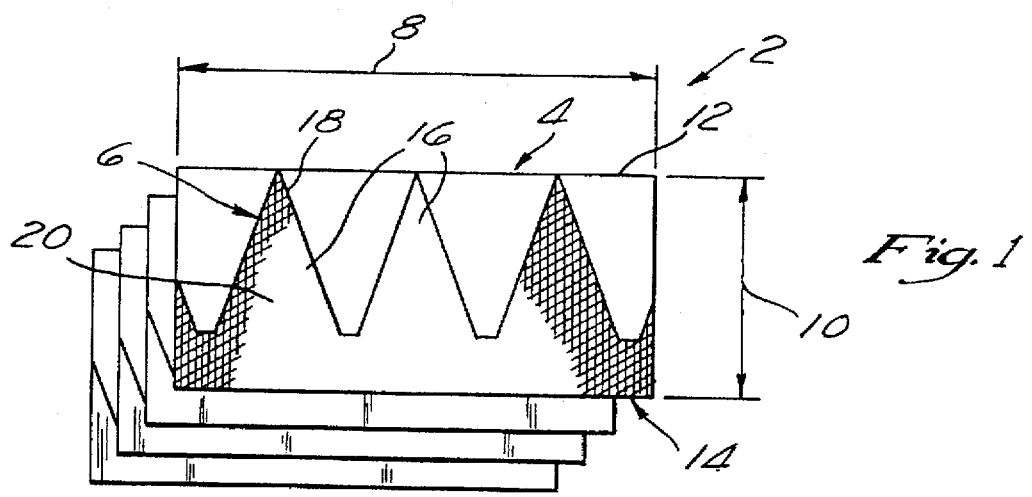
FIG. 1 illustrates a stack of sheets of material with a wedge-shaped pattern of lossy material applied to each sheet.

FIG. 1 illustrates a stack 2 of sheets of material 4, each sheet having a repeating wedge-shaped pattern of lossy material 6. Each sheet 4 has a length 8 and a height 10, height 10 extending between first and second edges 12, 14 of sheet 4. Each pattern 6 of lossy material is made up of wedge-shaped units 16 of the lossy material. Each wedge-shaped unit 16 has a narrow tip portion 18 adjacent first edge 12 and a broadened base portion 20 adjacent second edge 14. In the preferred embodiment, material 4 is preferably Kraft paper or Nomex™ while the lossy material is preferably carbon. Other lossy material, such as nichrome or silicon carbide, could also be used.

Figure 2:
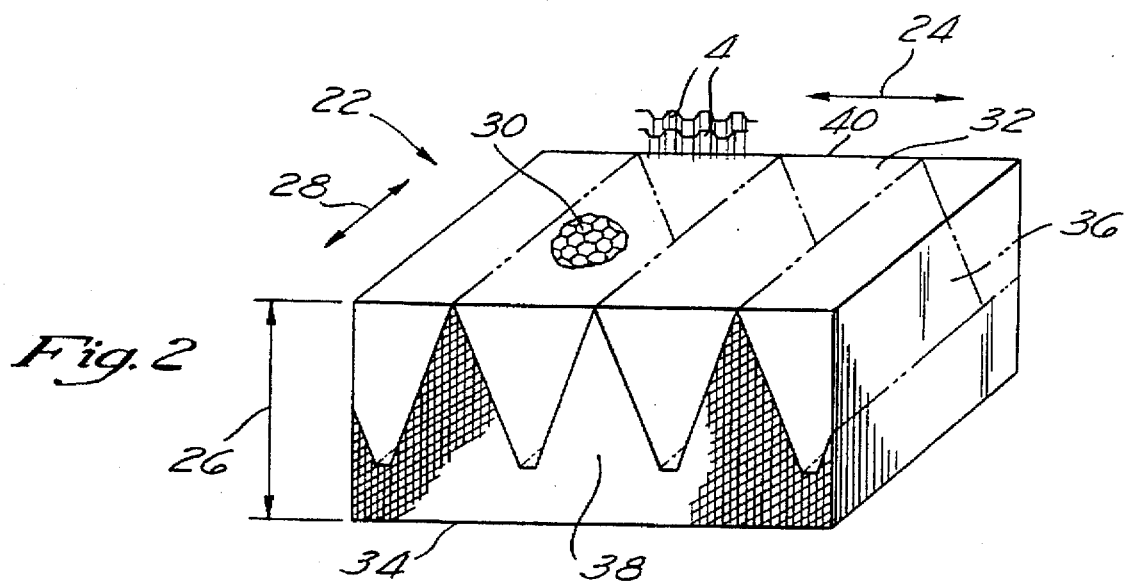
FIG. 2 shows a block of honeycomb material, made from a stack of the sheets of material of FIG. 1, having wedges of lossy material.

Stack 2 of sheets of material 4 are then formed into a block of honeycomb material 22 shown in FIG. 2. Honeycomb material is usually made in one of two ways. One way is to take flat sheets of material and corrugate it into half honeycomb shapes and then glue these corrugated sheets to one another. The other way is to take sheets of material and put glue lines on them. The glue lines between one set of sheets are offset from the glue lines between the sheets on either side. When the sheets are adhered to one another and the stack of sheets is expanded, an expanded honeycomb type of material results. The method of making the block of honeycomb material 22 is not part of this invention. Various methods for making honeycomb material are discussed in U.S. Pat. No. 5,312,511 to Fell, the disclosure of which is incorporated by reference.

Block 22 includes L and T directions 24, 26 corresponding to length 8 and height 10 of material 4. Block 22 also includes a W direction 28 which corresponds to the thickness of the stack 2 of material 4. As shown in FIG. 2, block 22 of honeycomb material is essentially a solid block with the hexagonal openings 30 extending from the top side 32 to the bottom side 34. The aligned stacks of wedge-shaped units 16 of lossy material form wedges 36 of lossy material as shown in FIG. 2. The wedges 36 of lossy material extend between the front side 38 and the back side 40 of block 22. Block 22 of honeycomb material, containing wedges 36 of lossy material, are useful in covering the sidewalls, ceiling and floor of anechoic chambers.

In this preferred embodiment, hexagonal opening 30 is about 0.28" wide. Block 22 is designed to absorb EMR in the 300 MHZ to above 1 GHz frequency range. Block 22 has a height in H dimension 26 of about 3 feet with the spacing between wedges 36 of about 14 inches. The height of block 22 is about half the height that a conventional carbon-loaded foam anechoic chamber absorber would be for the same frequency range. The weight of block 22 is about 10% of the weight of a conventional carbon-loaded polyurethane foam anechoic chamber absorber. Therefore, the anechoic chamber itself can be smaller because of the lesser height of block 22 and the walls and ceiling of the anechoic chamber need not be made as strong as with conventional absorbers because of the lower weight.

The use of carbon-loaded honeycomb as an absorber is described in U.S. patent application No. 07/890,757, titled Method for Making Material with Artificial Dielectric Constant, now U.S. Pat. No. 5,385,623, the disclosure of which is incorporated by reference. Carbon, or other lossy material, can be applied in a pattern or over the entire lossy surface according to the absorber characteristics desired.

Figure 3:
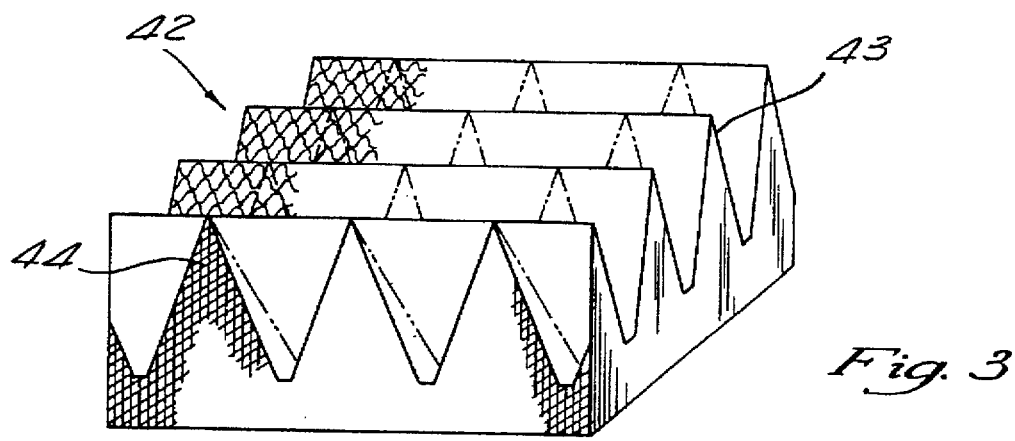
FIG. 3 illustrates the block of honeycomb material of FIG. 2 with wedges of honeycomb material removed from the block to create a grooved block of honeycomb material having pyramids of lossy material.

FIG. 3 illustrates the result of cutting wedge-shaped sections of material from block 22 to create a grooved block 42 of honeycomb material. Groove block 42 has wedge-shaped open regions 43 extending from top side 32 of block 22 down towards but not all the way to bottom side 34. Doing so results in creating pyramids 44 of lossy material. Groove block 42 can thus be used where pyramids of lossy material are needed, such as behind the radiation source and behind the target. They may also be used on the ceiling, sidewalls and floor adjacent to the front wall and back wall. Block 42 could be further modified to remove those portions of the material which do not contain lossy material. However, unless weight is a key concern, it is not expected to be necessary to do so.

Figure 4:
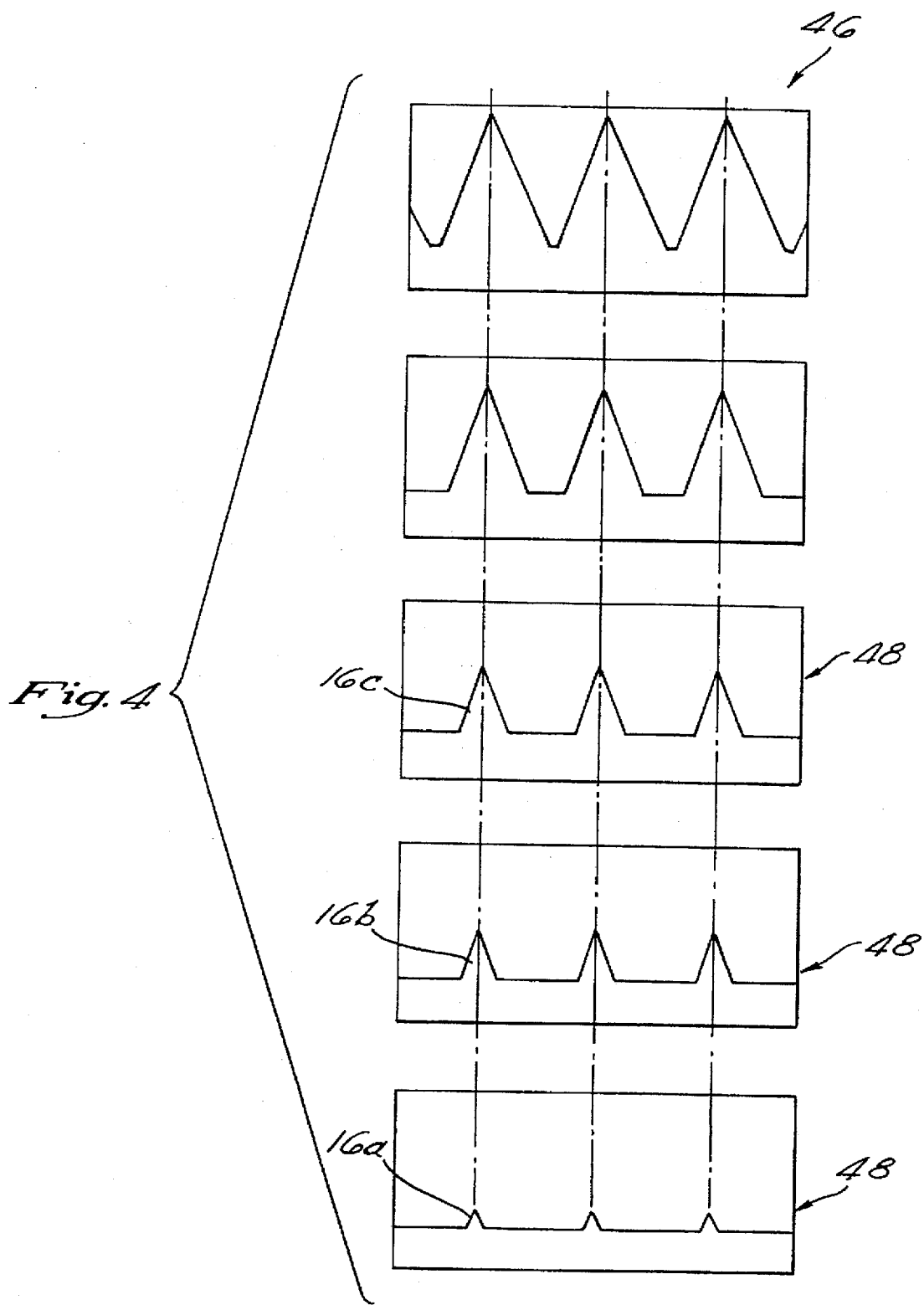
FIG. 4 shows a stack of sheets of material with wedge-shaped patterns of lossy material configured to create pyramids of lossy material without any cutting or grooving of the resulting block of honeycomb material as is required with the embodiment of FIGS. 1–3.
Figure 5:
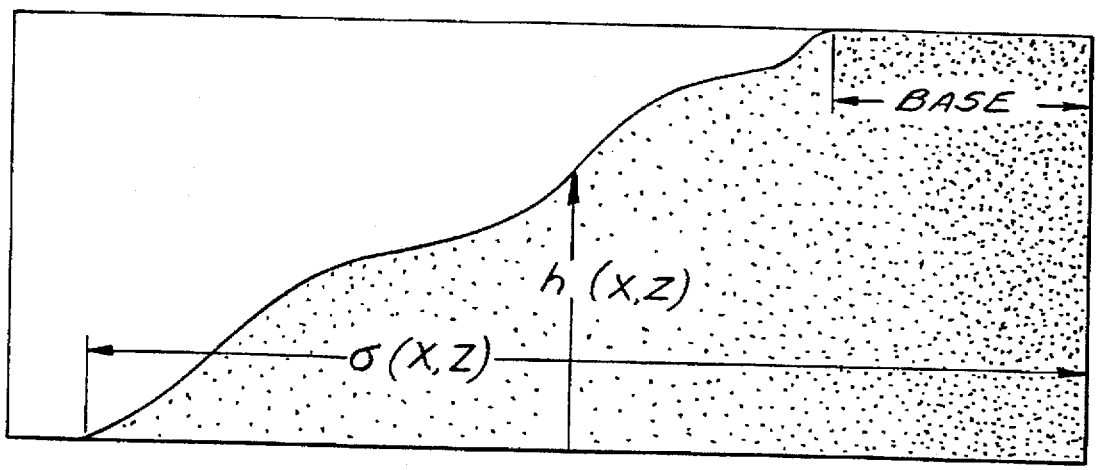
FIG. 5 illustrates a plot of conductivity versus height for X- and Z-dependent conductivity.

FIG. 4 illustrates a stack 46 of sheets of material 48 similar to those shown in FIG. 1 but in which successive sheets have increasingly larger wedge-shaped units 16a, 16b ... of lossy material formed on sheets 48. Doing so allows the user to create pyramids of lossy material without the need for any sort of cutting as is required to create pyramids of lossy material from the wedges of lossy material in block 22 of FIG. 2.

Material Design Process For The Preferred Embodiment

Designing the material involves a systematic adjustment of conductivity profiles and gradient parameters within a constrained design space.

Figure 7:
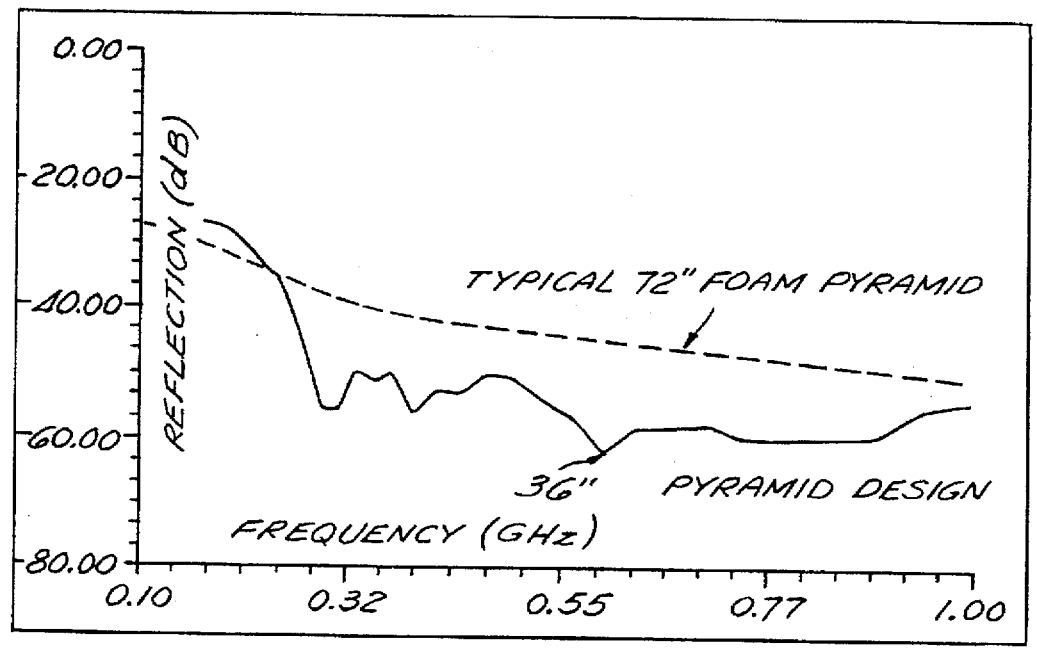
FIG. 7 plots reflection versus frequency for both a conventional 72" tall foam pyramid absorber and a 36" tall pyramid absorber made according to the present invention.

FIG. 7 illustrates the design space and associated variables available to optimize the absorber performance. Both the pyramidal region and the base have z-dependent conductivity profiles. The pyramidal region is allowed two-dimensional (x,z) conductivity gradients plus modulation of the basic pyramidal shape (h(x,z)).

$$\sigma = \sigma_0 \, [r_0 + r_2 Z^{(P_1 + c \, \sin \, (3\pi Z)) P_2}]$$

where:

$r_0$=tip conductivity factor $r_2$=conductivity scaling factor $p_1$=profile compensation factor $c$=sinusoidal ripple coefficient $p_2$=Z dependent power profile $\sigma_0$=initial conductivity in Siemens/m.

FIG. 7 illustrates an initial conductivity design space offering maximum degrees of freedom. Both x-dependent and z-dependent conductivity gradients are possible.

For the preferred embodiment of straight sided pyramids, the equation reduces to $$\sigma = \sigma_0 \, [r_0 + r_2 Z^{P_2}]$$

where:

$r_0$=tip conductivity factor $r_2$=conductivity scaling factor $p_2$=Z dependent power profile $\sigma_0$=initial conductivity.

Figure 6:
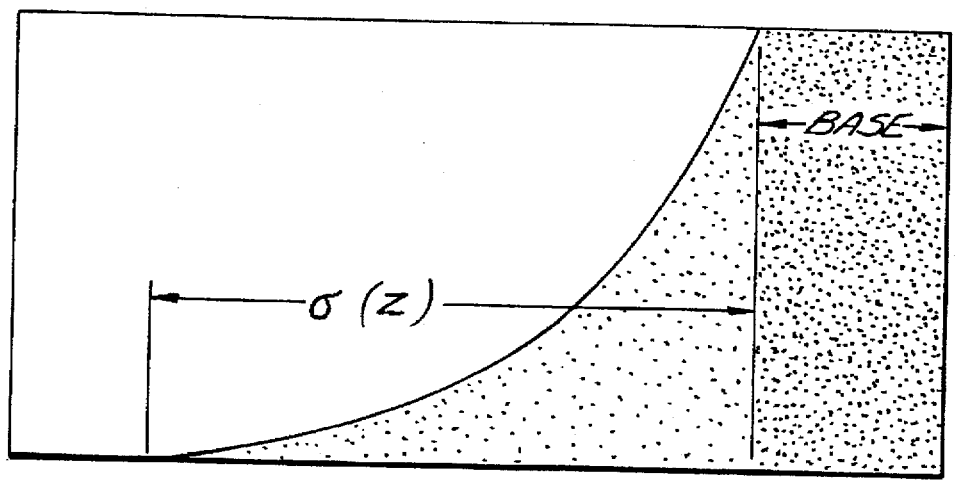
FIG. 6 illustrates a plot of conductivity versus height for Z-dependent conductivity.
Figure 8:
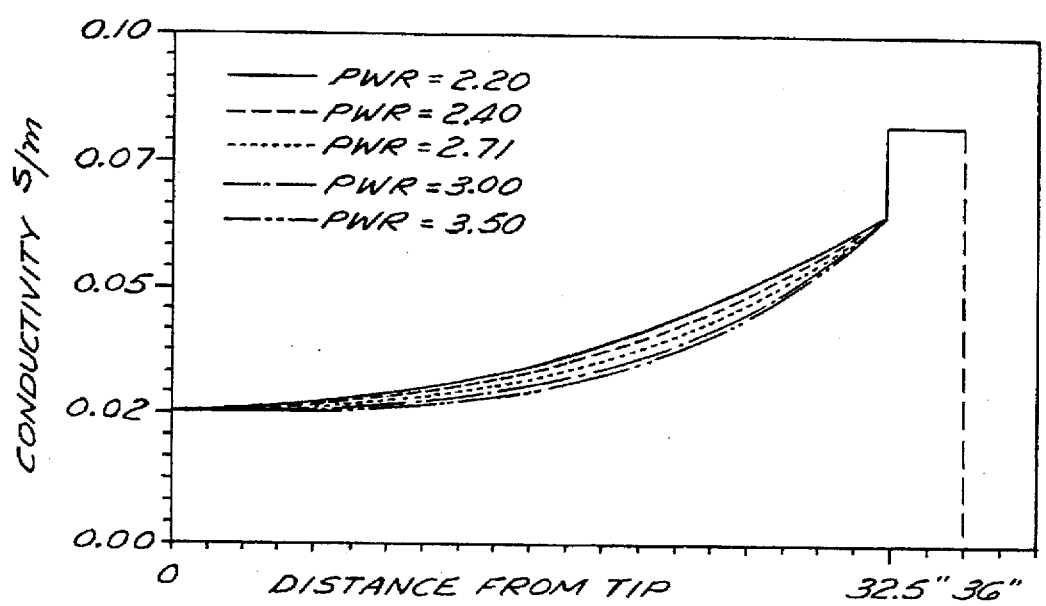
FIG. 8 plots calculated conductivity versus distance from tip.

FIG. 6 shows a reduced conductivity design space having only z-dependence in the pyramidal region. In this reduced design space, the performance of the absorber is influenced by the initial tip conductivity, final pyramidal conductivity, the profile by which the conductivity increases from its initial to final value, and the conductivity of the base region. FIG. 7 shows the conductivity profile for the preferred embodiment designed to operate from 300 MHz upwards. FIG. 8 shows the calculated performance.

Modification and variation can be made to the disclosed embodiments without departing from the subject of the invention as defined in the following claims. For example, in the preferred embodiment, wedges 36 and pyramids 44 of lossy material are shown having flat sides and extending to relatively sharp tips; they could have convex, concave or irregularly-shaped sides and need not terminate in a sharpened tip according to the performance desired, manufacturing requirements and use restrictions. Instead of honeycomb having hexagonal openings, the blocks of honeycomb material could be made from other types of open cellular material having other shapes of openings. The honeycomb material could be made with, for example, composite skins bonded to top and bottom sides 32, 34 thus sealing openings 30; this adds structural strength, facilitates stacking of the absorbers and keeps the interiors of the honeycomb cells sealed to prevent collection of charged dust particles which could change the electrical properties of the absorber.

What is claimed is:

1. A method of making an anechoic chamber absorber comprising the following steps:

selecting sheets of material each having first and second edges defining a length and a height;

applying a lossy material to the sheets of material in a repeating wedge-shaped pattern, said wedge-shaped pattern including periodic wedge-shaped units extending along the length of the sheets of material, the wedge-shaped units having narrow tip portions facing the first edge and broadened base portions facing the second edge; and creating a block of honeycomb material from the sheets of material with said lossy material applied in the wedge-shaped pattern thereby creating wedges of lossy material within the block of honeycomb material, said block of honeycomb material having an T-direction and a L-direction, corresponding to the height and length of the sheets of material, and a W-direction.

2. The method according to claim 1 wherein the applying step is carried out with the narrow tip portions extending to the first edges.

3. The method according to claim 1 wherein the applying step is carried out by applying carbon as the lossy material.

4. The method according to claim 1 wherein the applying step includes the step of selecting the wedge-shaped units with straight sides between the tip portion and the base portion.

5. The method according to claim 1 further comprising the step of removing wedges of honeycomb material from the block of honeycomb material in the L-direction to create a grooved block of honeycomb material thereby creating wedges of honeycomb material extending in the L-direction and pyramids of lossy material within the wedges of honeycomb material.

6. The method according to claim 5 wherein said removing step is carried out so that said wedges of honeycomb material have pointed tips and flat sides.

7. A method of making an anechoic chamber absorber comprising the following steps:

selecting sheets of material each including lossy material and having first and second edges defining a length and a height;

creating a block of honeycomb material from the sheets of material; and creating wedges of lossy material within the block of honeycomb material, said block of honeycomb material having an T-direction and a L-direction, corresponding to the height and length of the sheets of material, and a W-direction.

8. The method according to claim 7 wherein the creating step includes the step of applying a lossy material to sheets of material in a repeating wedge-shaped pattern, said wedge-shaped pattern including periodic wedge-shaped units extending along the length of the sheets of material, the wedge-shaped units having narrow tip portions facing the first edge and broadened base portions facing the second edge.

9. The method according to claim 8 further comprising the step of removing wedge-shaped sections of honeycomb material from the block of honeycomb material in the L-direction to create a grooved block of honeycomb material thereby creating wedges of honeycomb material extending in the L-direction and pyramids of lossy material within the wedges of honeycomb material.

10. The method according to claim 7 further comprising the step of removing wedge-shaped sections of honeycomb material from the block of honeycomb material in the L-direction to create a grooved block of honeycomb material.

11. The method according to claim 10 wherein the removing step creates wedges of honeycomb material extending in the L-direction and pyramids of lossy material within the wedges of honeycomb material.

12. A method of making an anechoic chamber absorber comprising the following steps:

selecting sheets of material each having first and second edges defining a length and a height;

applying a lossy material to the sheets of material in a repeating wedge-shaped pattern, said wedge-shaped pattern including periodic wedge-shaped units extending along the length of the sheets of material, the wedge-shaped units having narrow tip portions facing the first edge and broadened base portions facing the second edge;

periodically increasing and decreasing the heights of the wedge-shaped units applied to successive ones of the sheets of material; and creating a block of honeycomb material from the sheets of material with said lossy material applied in the wedge-shaped pattern thereby creating pyramids of lossy material within the block of honeycomb material.

* * * * *